US012635095B2

(12) United States Patent
Wu et al.

(10) Patent No.: US 12,635,095 B2
(45) Date of Patent: May 19, 2026

(54) DEVICE COVER WITH ACCESS DOOR

(71) Applicant: TOSHIBA GLOBAL COMMERCE SOLUTIONS, INC., Durham, NC (US)

(72) Inventors: Pohan Wu, Taipei (TW); Chen-ming Hsu, Taipei (TW); Po Jen Hsu, New Taipei (TW); LiRui Chen, Taipei (TW)

(73) Assignee: TOSHIBA GLOBAL COMMERCE SOLUTIONS, INC., Durham, NC (US)

( * ) Notice: Subject to any disclaimer, the term of this patent is extended or adjusted under 35 U.S.C. 154(b) by 193 days.

(21) Appl. No.: 18/668,002

(22) Filed: May 17, 2024

(65) Prior Publication Data

US 2025/0358946 A1     Nov. 20, 2025

(51) Int. Cl.
*H05K 5/03*          (2006.01)
*H05K 5/02*          (2006.01)

(52) U.S. Cl.
CPC ............. *H05K 5/03* (2013.01); *H05K 5/0221* (2013.01)

(58) Field of Classification Search
CPC ............................... H05K 5/03; H05K 5/0221
See application file for complete search history.

(56) References Cited

U.S. PATENT DOCUMENTS

| | | | | |
|---|---|---|---|---|
| 6,721,183 | B1 * | 4/2004 | Chen | G06F 1/181 |
| | | | | 16/404 |
| 7,272,011 | B2 * | 9/2007 | Chen | G06F 1/181 |
| | | | | 361/726 |
| 7,894,186 | B2 * | 2/2011 | Farrow | G06F 1/181 |
| | | | | 361/679.57 |
| 12,174,675 | B2 * | 12/2024 | Xu | G06F 1/185 |
| 2003/0080567 | A1 * | 5/2003 | Peacock | E05C 9/043 |
| | | | | 292/3 |
| 2022/0078933 | A1 * | 3/2022 | Shinde | H02B 1/42 |
| 2022/0124939 | A1 * | 4/2022 | Hoglund | G06F 1/182 |
| 2022/0210936 | A1 * | 6/2022 | Hilliard | G06F 1/181 |
| 2022/0394869 | A1 * | 12/2022 | Park | E05B 53/003 |

* cited by examiner

*Primary Examiner* — Sagar Shrestha
(74) *Attorney, Agent, or Firm* — Patterson + Sheridan, LLP; Gero G. McClellan

(57) ABSTRACT

The present disclosure describes an electronic device that includes an enclosure with a door that provides access to the components of the electronic device within the enclosure. According to an embodiment, an apparatus includes a body, a cover defining an opening in a surface of the cover, a door arranged to cover the opening, and first and second levers coupled to the cover. The first lever and the second lever are actuatable between a locked state and an unlocked state and secure the cover to the body to form an enclosure when in the locked state. When the first lever is in the unlocked state and the second lever is in the locked state, the door is unlocked. When both the first lever and the second lever are in the unlocked state, the cover is disengaged from the body.

20 Claims, 13 Drawing Sheets

110

DEVICE COVER WITH ACCESS DOOR

BACKGROUND

An electronic device (e.g., in a checkout station) is typically housed in an enclosure formed by engaging a cover to a body. The cover protects the electronic device from damage. The cover, however, may make it difficult to access the electronic device and/or the components of the electronic device within the enclosure. For example, to access the components of the electronic device (e.g., for service), the cover may be unlocked and removed entirely from the body, which may be a cumbersome and time intensive process.

DETAILED DESCRIPTION

The present disclosure describes an electronic device that includes an enclosure with a door that provides access to the components of the electronic device within the enclosure (e.g., storage devices). The door may be opened to provide access to the components of the electronic device even though the cover is engaged to the body. The cover includes levers that secure the cover to the body. Actuating all of the levers disengages the cover from the body such that the cover may be removed from the body. Actuating one of (or less then all of) the levers unlocks the door such that the door may be opened to provide access to the components of the electronic device within the enclosure.

Technical Advantages

In certain embodiments, the enclosure provides several technical advantages. For example, the enclosure allows access to the components of the electronic device within the enclosure while keeping the cover engaged to the body. As another example, the enclosure may provide certain mechanisms that lock the door and prevent the door from opening in certain situations, which may improve the security provided by the cover to the components of the electronic device within the enclosure.

Figure 1A:
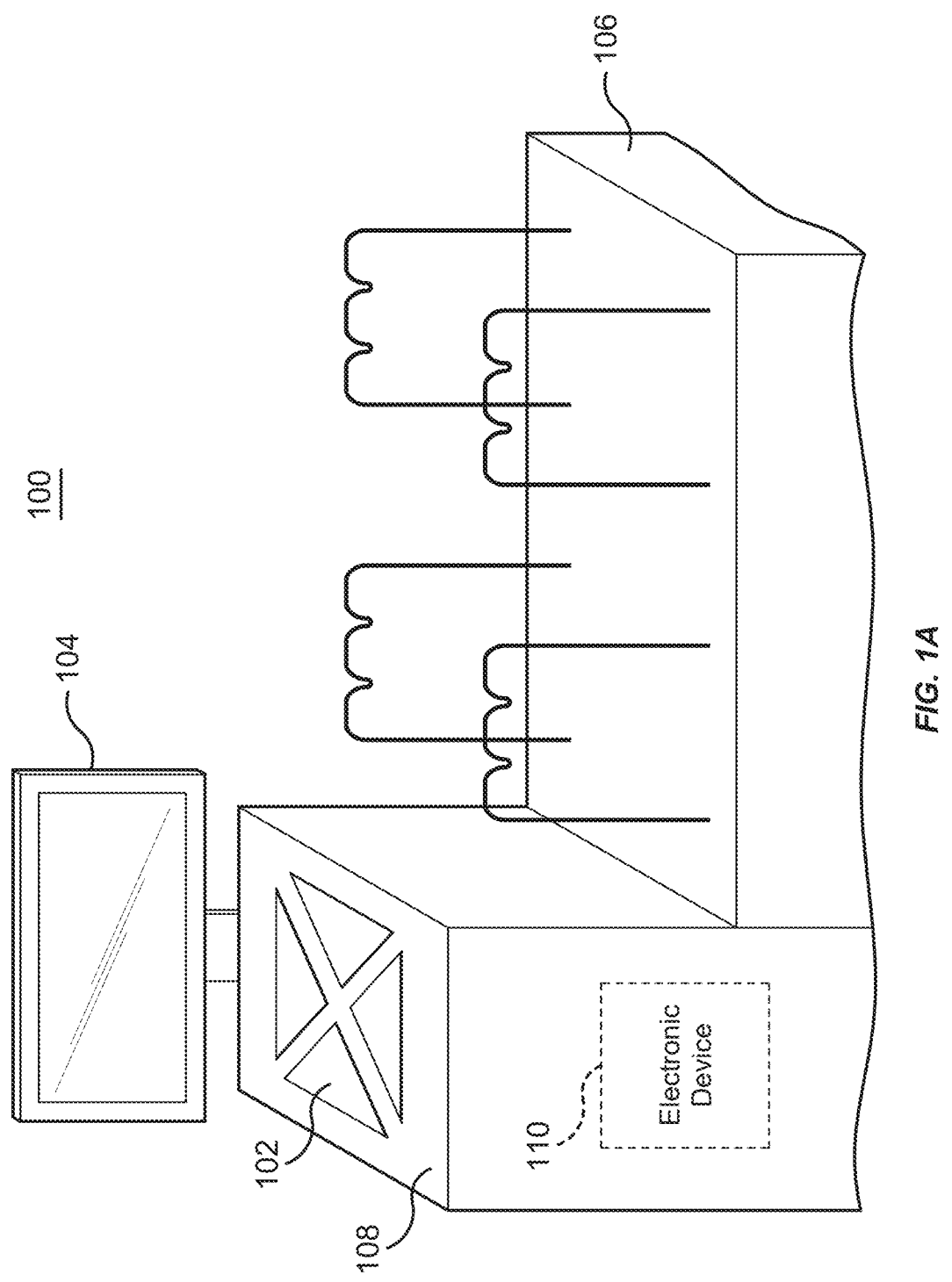
FIGS. 1A and 1B illustrate an example system.

FIG. 1A illustrates an example system 100. Generally, the system 100 may be a self-checkout system. As seen in FIG. 1A, the system 100 includes a scanner 102, a display 104, a bagging area 106, a cabinet 108, and an electronic device 110. Generally, the scanner 102 is used to scan a barcode on an item. The system 100 may then identify the item based on the scanned barcode and add the item to a transaction. The display 104 may indicate the item that is added to the transaction. The bagging area 106 may be used to store or hold the scanned items.

The cabinet 108 provides structural support for some of the components of the system 100. For example, the cabinet 108 may physically support the scanner 102 and the display 104. The cabinet 108 may also store or hold other components of the system 100. As seen in FIG. 1A, the cabinet 108 holds the electronic device 110 within the interior of the cabinet 108. The cabinet 108 may include a door or panel that opens to provide access to the interior of the cabinet 108. For example, the door or panel may be opened to service the electronic device 110 in the interior of the cabinet 108.

Figure 1B:
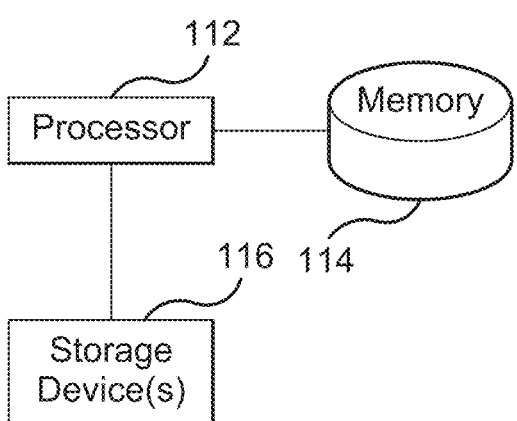

The electronic device 110 may perform some of the functions or features of the system 100 (e.g., checkout functions or features). For example, the electronic device 110 may be a computer system that processes transactions conducted by the system 100. FIG. 1B illustrates certain components of the electronic device 110. As seen in FIG. 1B, the electronic device 110 includes certain electronic components, such as a processor 112, a memory 114, and/or one or more storage devices 116.

The processor 112 is any electronic circuitry, including, but not limited to one or a combination of microprocessors, microcontrollers, application specific integrated circuits (ASIC), application specific instruction set processor (ASIP), and/or state machines, that communicatively couples to the memory 114 and controls the operation of the electronic device 110. The processor 112 may be 8-bit, 16-bit, 32-bit, 64-bit or of any other suitable architecture. The processor 112 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 112 may include other hardware that operates software to control and process information. The processor 112 executes software stored on the memory 114 to perform any of the functions described herein. The processor 112 controls the operation and administration of the electronic device 110 by processing information (e.g., information received from the checkout system and memory 114). The processor 112 is not limited to a single processing device and may encompass multiple processing devices contained in the same device or computer or distributed across multiple devices or computers. The processor 112 is considered to perform a set of functions or actions if the multiple processing devices collectively perform the set of functions or actions, even if different processing devices perform different functions or actions in the set.

The memory 114 may store, either permanently or temporarily, data, operational software, or other information for the processor 112. The memory 114 may include any one or a combination of volatile or non-volatile local or remote devices suitable for storing information. For example, the memory 114 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 114, a disk, a CD, or a flash drive. In some embodiments, the software may include an application executable by the processor 112 to perform one or more of the functions described herein. The memory 114 is not limited to a single memory and may encompass multiple memories contained in the same device or computer or distributed across multiple devices or computers. The memory 114 is considered to store a set of data, operational software, or information if the multiple memories collectively store the set of data, operational software, or information, even if different memories store different portions of the data, operational software, or information in the set.

The storage device 116 may store information or program code used by the processor 112 and the memory 114. For example, the storage device 116 may include hard drives, solid state drives, or other devices that hold or store data. The storage device 116 may hold or store the data even after the electronic device 110 is powered down or powered off. When the electronic device 110 is powered on again, the electronic device 110 may retrieve the stored information or data from the storage device 116 to continue operation.

In some embodiments, the electronic components of the electronic device 110 (e.g., the processor 112, memory 114, and/or storage device 116) are housed within an enclosure that protects the electronic components from damage or wear. The enclosure may be formed by engaging a cover onto a body. The cover may be disengaged from the body by actuating (e.g., pushing in) levers coupled to the cover. After disengaging the cover from the body, the cover may be removed from the body to expose the electronic components of the electronic device 110 (e.g., for service or maintenance). Actuating the levers to disengage the cover from the body, however, may be a cumbersome process. In some embodiments, the cover includes a door that can be opened to expose some of the electronic components of the electronic device 110 (e.g., the storage device 116) when one of the levers on the cover is actuated and the other lever is not actuated. Thus, the door provides an easier way to service the electronic components of the electronic device 110.

Figure 2A:
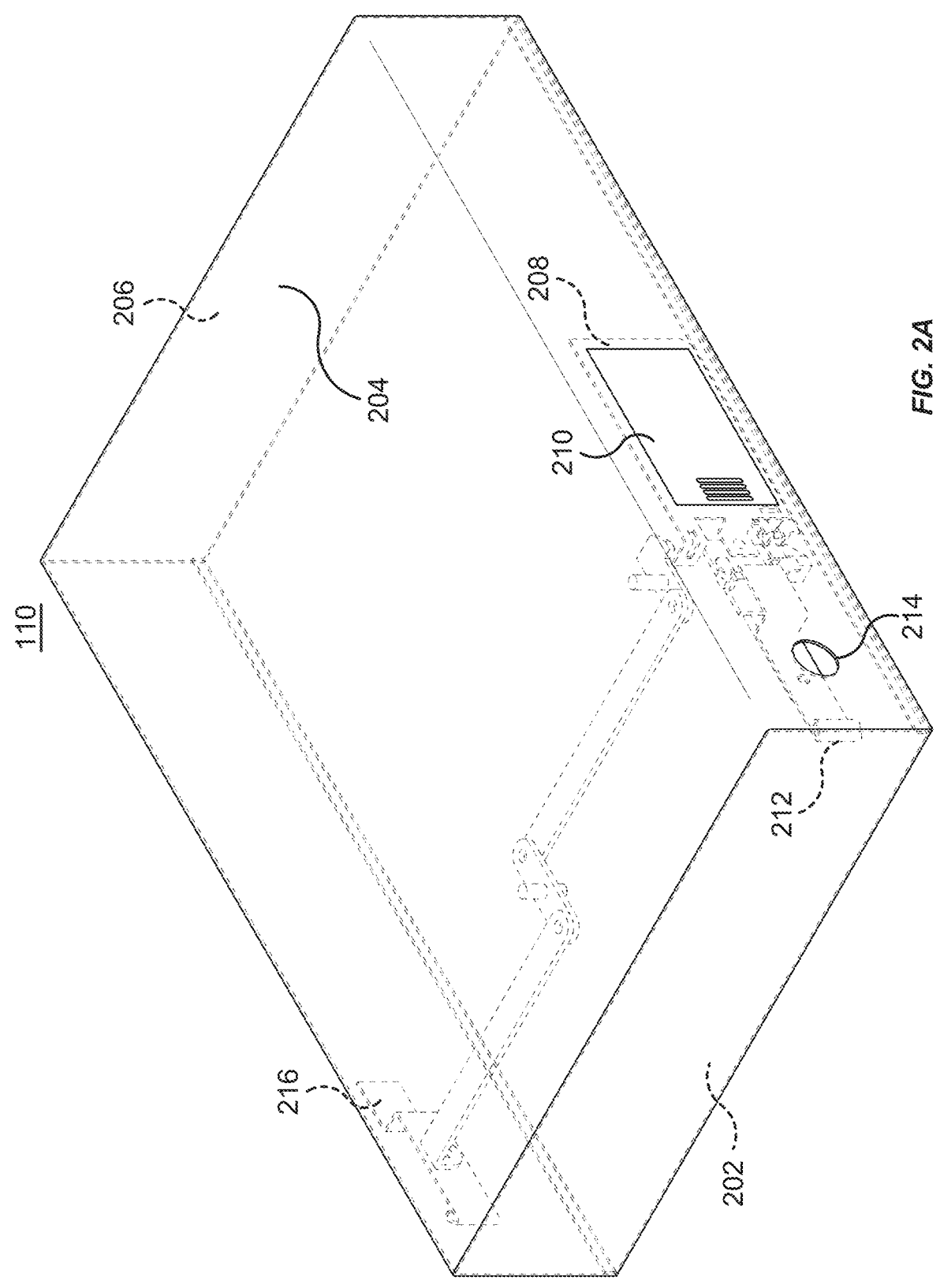
FIGS. 2A and 2B illustrate an example electronic device in the system of FIG. 1A.

FIG. 2A illustrates an example electronic device 110 in the system 100 of FIG. 1A. As seen in FIG. 2A, the electronic device 110 includes a body 202 and a cover 204. The cover 204 engages with and secures to the body 202 to form an enclosure 206. For clarity, some of the electronic components of the electronic device 110 (e.g., the processor 112, the memory 114 and the storage device 116) housed within the enclosure 206 are not illustrated in FIG. 2A.

The body 202 may form a foundation for the other components of the electronic device 110 (e.g., the electronic components of the electronic device 110). As seen in FIG. 2A, the body 202 may form a bottom surface of the electronic device 110. The cover 204 may be positioned on the body 202 to engage the body 202. When the cover 204 is engaged with the body 202, the cover 204 may be securely attached to the body 202. The cover 204 and the body 202 then form the enclosure 206 that houses the other components of the electronic device 110.

The cover 204 defines an opening 208 in the cover 204. The opening 208 may allow access through the cover 204 to the interior of the enclosure 206. As a result, the opening 208 may provide access to the electronic components housed within the enclosure 206. For example, the opening 208 may provide access to a storage device 116 (e.g., a solid state drive) for service or maintenance purposes. A door 210 is movably coupled to the cover 204. The door 210 may be in a closed or open state. When the door is in a closed state, the door 210 covers the opening 208 and prevents access to the interior of the enclosure 206 through the opening 208. When the door 210 is in the open state, the interior of the enclosure 206 is accessible through the opening 208. In the example of FIG. 2A, the door 210 is in the closed state. The door 210 may be moved (e.g., slid open or pulled open) to reveal the opening 208 and the interior of the enclosure 206.

A first lever 212 is positioned within the enclosure 206 and coupled to the cover 204. For example, the first lever 212 may be coupled to the cover 204 with a screw, a bolt, another lever, an adhesive, a weld, etc. Additionally, the cover 204 defines an opening 214, through which the first lever 212 may be actuated. For example, to actuate the first lever 212, an object or a finger may extend through the opening 214 to push the first lever 212 towards the interior of the enclosure 206. A second lever 216 is also positioned in the enclosure 206 and coupled to the cover 204 (e.g., using a screw, a bolt, another lever, an adhesive, a weld, etc.). The second lever 216 may be positioned at an opposite end of the cover 204 relative to the first lever 212. Similar to the first lever 212, the cover 204 may define another opening (shown in FIG. 2B) through which the second lever 216 may be actuated. For example, an object or finger may be extended through that opening to push the second lever 216 towards the interior of the enclosure 206.

Actuating the levers 212 and 216 may cause the levers 212 and 216 to transition from a locked state (in which the levers 212 and 216 keep the cover 204 engaged with the body 202) to an unlocked state (in which the cover 204 is disengaged from the body 202). The levers 212 and 216 may be coupled to the cover 204 such that the levers 212 and 216 remain in the locked state if no external force is exerted on the levers 212 and 216. When an external force is applied to the levers 212 and 216 (e.g., pushing the levers 212 and 216 towards the interior of the enclosure 206), the levers 212 and 216 transition to the unlocked state. When that force is removed or stopped, the levers 212 and 216 return to the locked state. When the first and second levers 212 and 216 are in the unlocked state, the cover 204 may disengage from the body 202 and the cover 204 may be removable from the body 202. If one or both of the levers 212 and 216 are in the locked state, the cover 204 may remain engaged with the body 202.

The electronic device 110 may include mechanisms that keep the door 210 locked so that the door 210 may not move to expose the opening 208 and the interior of the enclosure 206. For example, if the lever 212 is not actuated, then a latch may keep the door 210 locked. As another example, if the lever 216 is actuated, then an arm and a latch may keep the door 210 locked. As yet another example, when the cover 204 is disengaged and/or removed from the body 202, a latch may keep the door 210 locked. In this manner, the door 210 may be unlocked when the cover 204 is engaged with the body 202, when the lever 212 is in the unlocked state, and when the lever 216 is in the locked state.

Figure 2B:
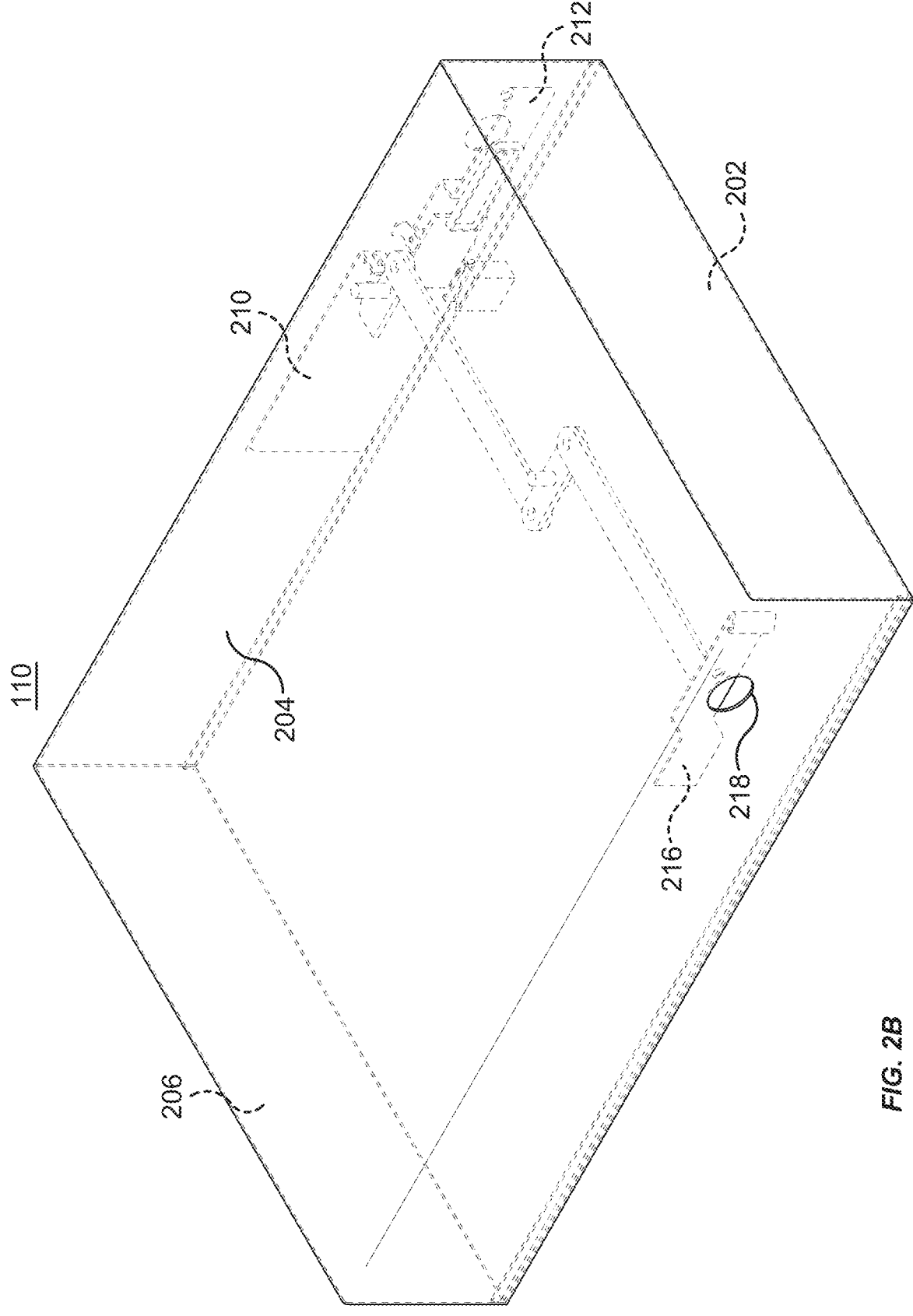

FIG. 2B illustrates another perspective of the electronic device 110 of the system 100 of FIG. 1A. As seen in FIG. 2B, the electronic device 110 includes the cover 204 that is engaged to the body 202 to form the enclosure 206. The door 210 is closed. Additionally, the cover 204 defines an opening 218 through which the lever 216 may be actuated. For example, an object or a finger may be extended through the opening 218 to push the lever 216 towards the interior of the enclosure 206. When both the levers 212 and 216 are in the unlocked state, the cover 204 may disengage from the body 202 and may be removed from the body 202.

Figure 3A:
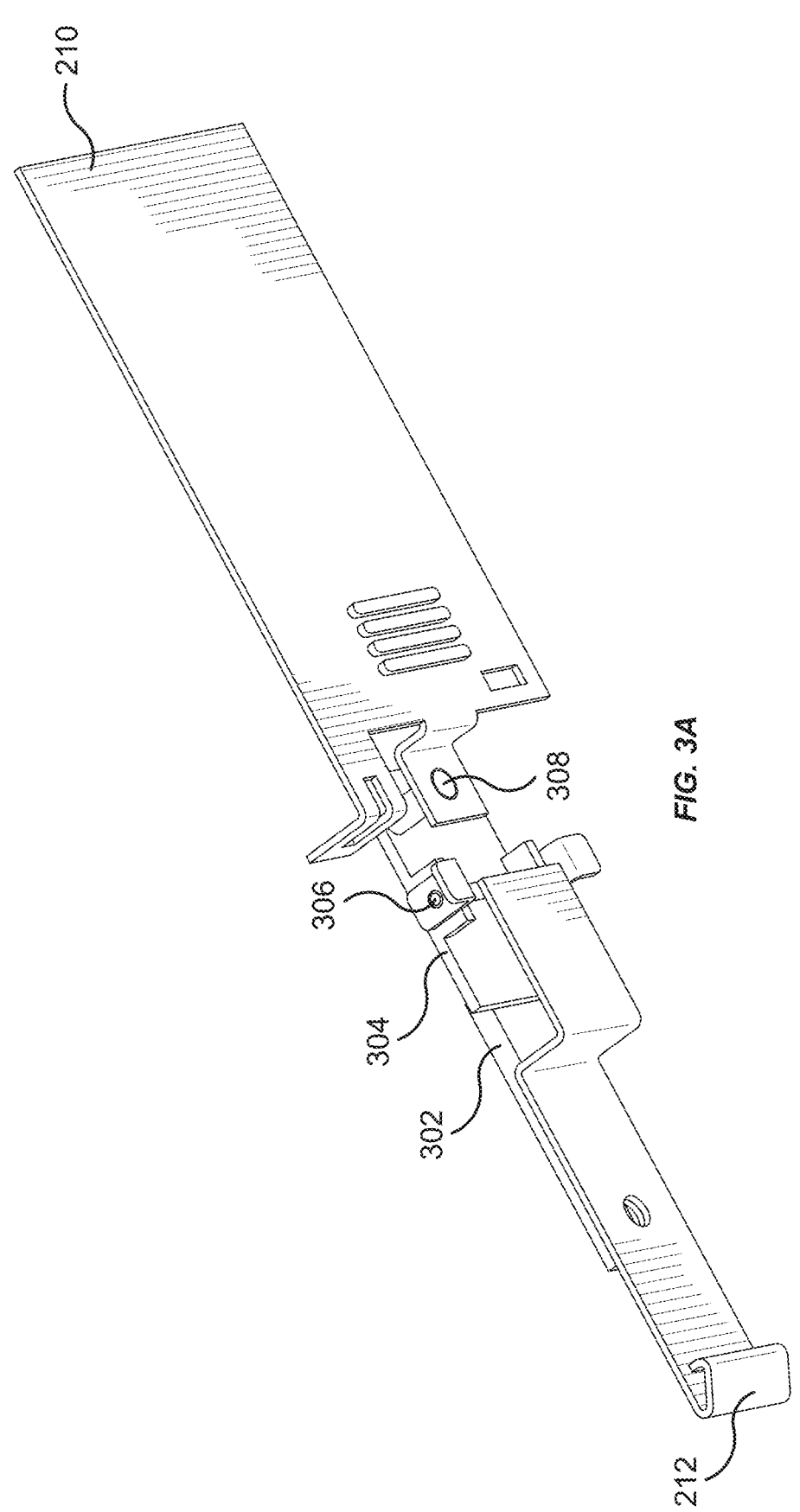
FIGS. 3A, 3B, and 3C illustrate portions of an example cover of the electronic device in the system of FIG. 1A.
Figure 3B:
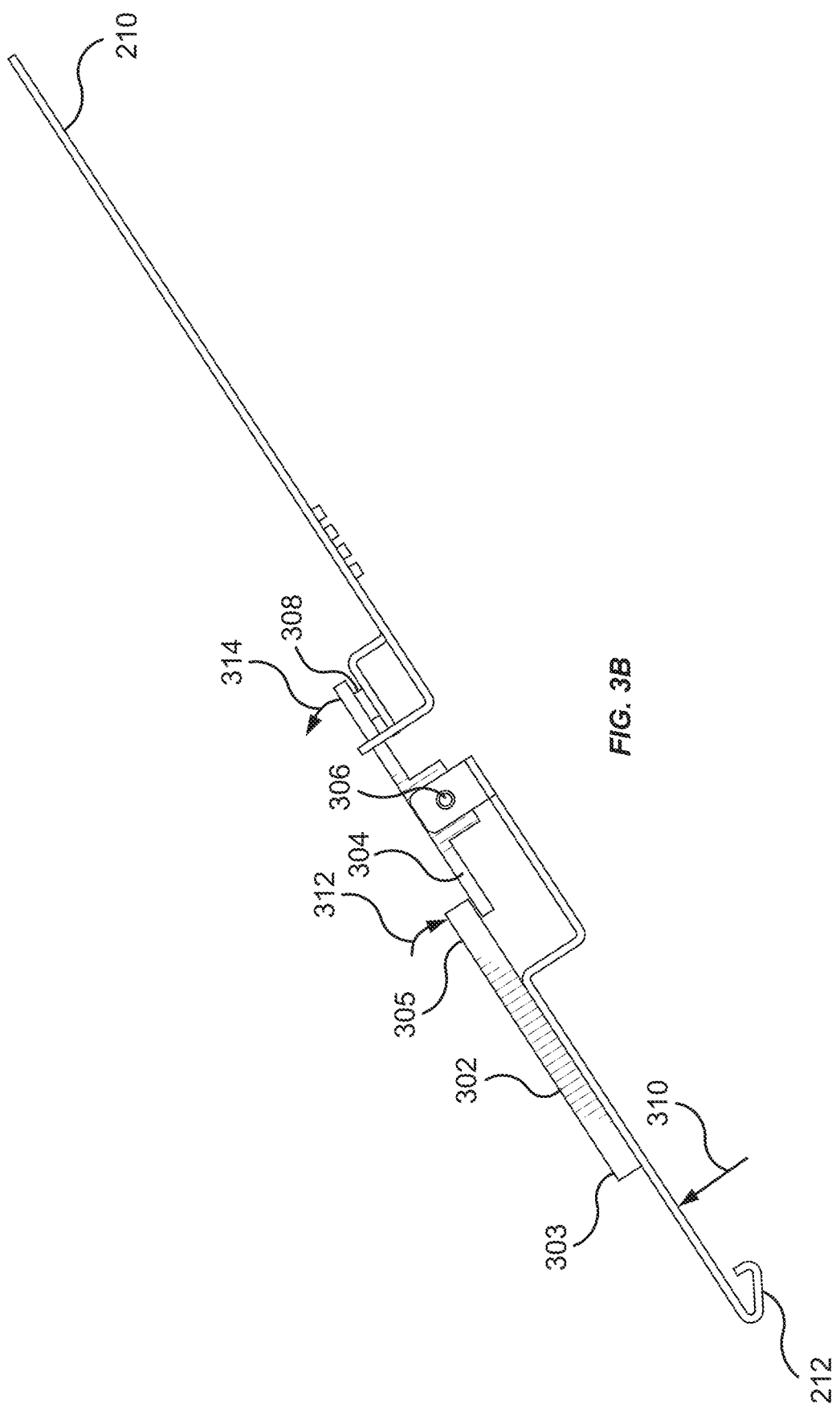
Figure 3C:
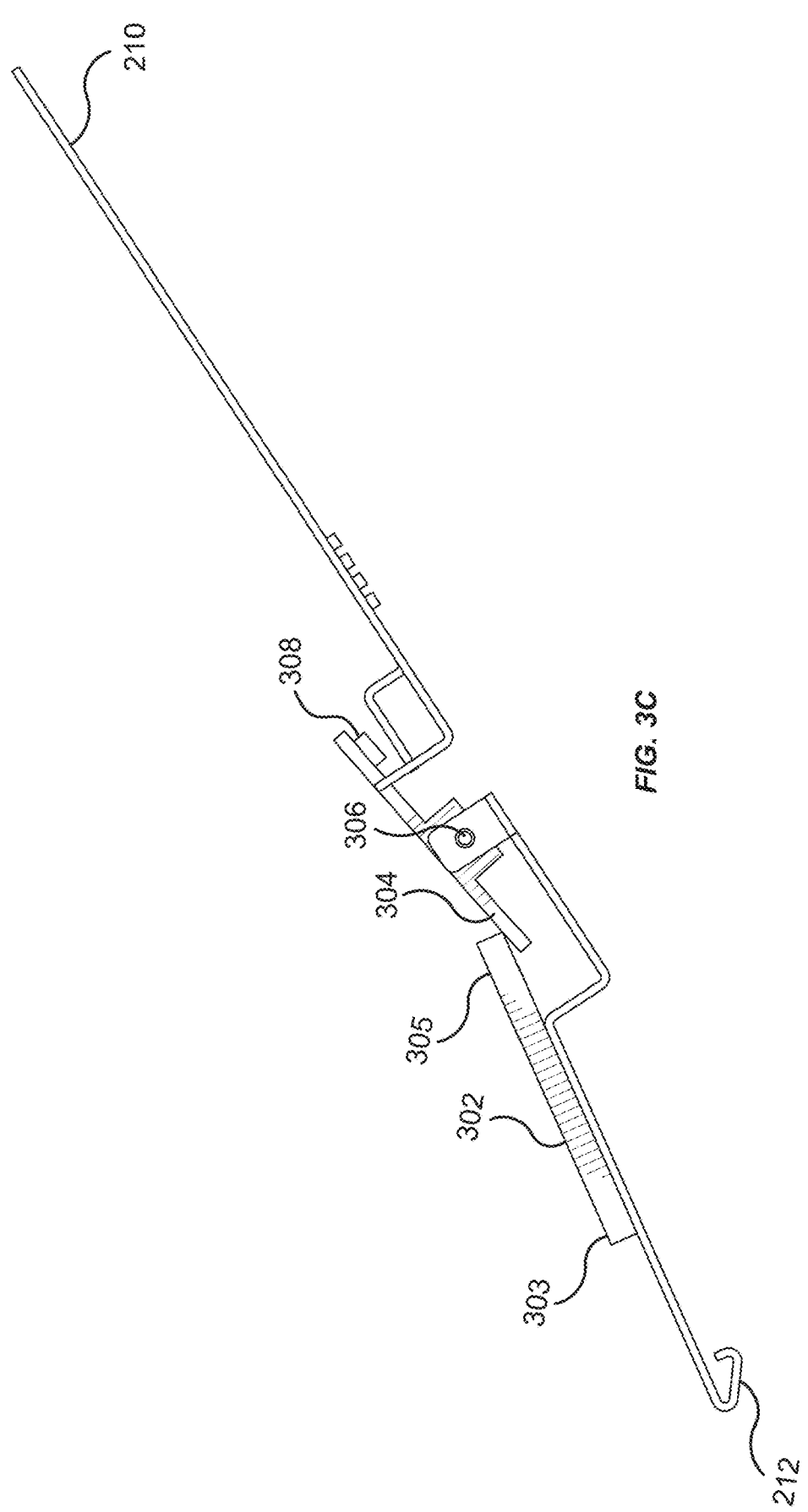

FIGS. 3A, 3B, and 3C illustrate portions of an example cover 204 of the electronic device 110 in the system 100 of FIG. 1A. Generally, FIG. 3A shows a side view of the mechanism that locks the door 210 when the first lever 212 is not actuated (e.g., when the first lever 212 is in the locked state). The mechanism may be positioned within the enclosure 206.

As seen in FIG. 3A, an arm 302 is positioned by the first lever 212. The arm 302 may be fixedly attached to the first lever 212 (e.g., by a screw, bolt, adhesive, weld, etc.). The arm 302 may be positioned on the side of the first lever 212 that is towards the interior of the enclosure 206. Additionally, a latch 304 is positioned by the arm 302. The latch 304 may be secured by a pin or post 306 such that the latch 304 may rotate about the pin or post 306 (e.g., such that the latch 304 may engage or disengage the door 210). For example, the latch 304 includes a stub 308 that extends from the latch 304 and towards the door 210. The stub 308 may be shaped such that the stub 308 engages the door 210 when the first lever 212 is in the locked state. When the stub 308 engages the door 210, the stub 308 locks the door 210 and prevents the door 201 from opening.

FIG. 3B shows a top view of the mechanism that locks the door 210 when the first lever 212 is not actuated. As seen in FIG. 3B, the first lever 212 is still in the locked state. The arm 302 is positioned by the first lever 212 and includes the ends 303 and 305. The end 303 is positioned by the first lever 212, and the end 305 is positioned by the latch 304. When the first lever 212 is actuated (e.g., pushed in the direction of the arrow 310), the first lever 212 moves in the direction of the arrow 310 to the unlocked state. When the first lever 212 moves in the direction of the arrow 310, the first lever 212 pushes against the end 303 of the arm 302. As a result, the opposite end 305 of the arm 302 moves in the direction of the arrow 312 and pushes on the latch 304. The latch 304 then rotates about the pin or post 306 (e.g., in a counter-clockwise direction in the perspective shown in FIG. 3B). The rotation of the latch 304 causes the stub 308 extending from the latch 304 to move in the direction of the arrow 314. As a result, the stub 308 disengages the door 210.

FIG. 3C shows a top view of the mechanism that locks the door 210 when the first lever 212 is not actuated. As seen in FIG. 3C, the first lever 212 is in the unlocked state. The first lever 212 pushes on the end 303 of the arm 302, which causes the end 305 of the arm 302 to push on the latch 304. The latch 304 rotates about the pin or post 306 such that the stub 308 moves away from the door 210 and disengages the door 210.

Figure 4A:
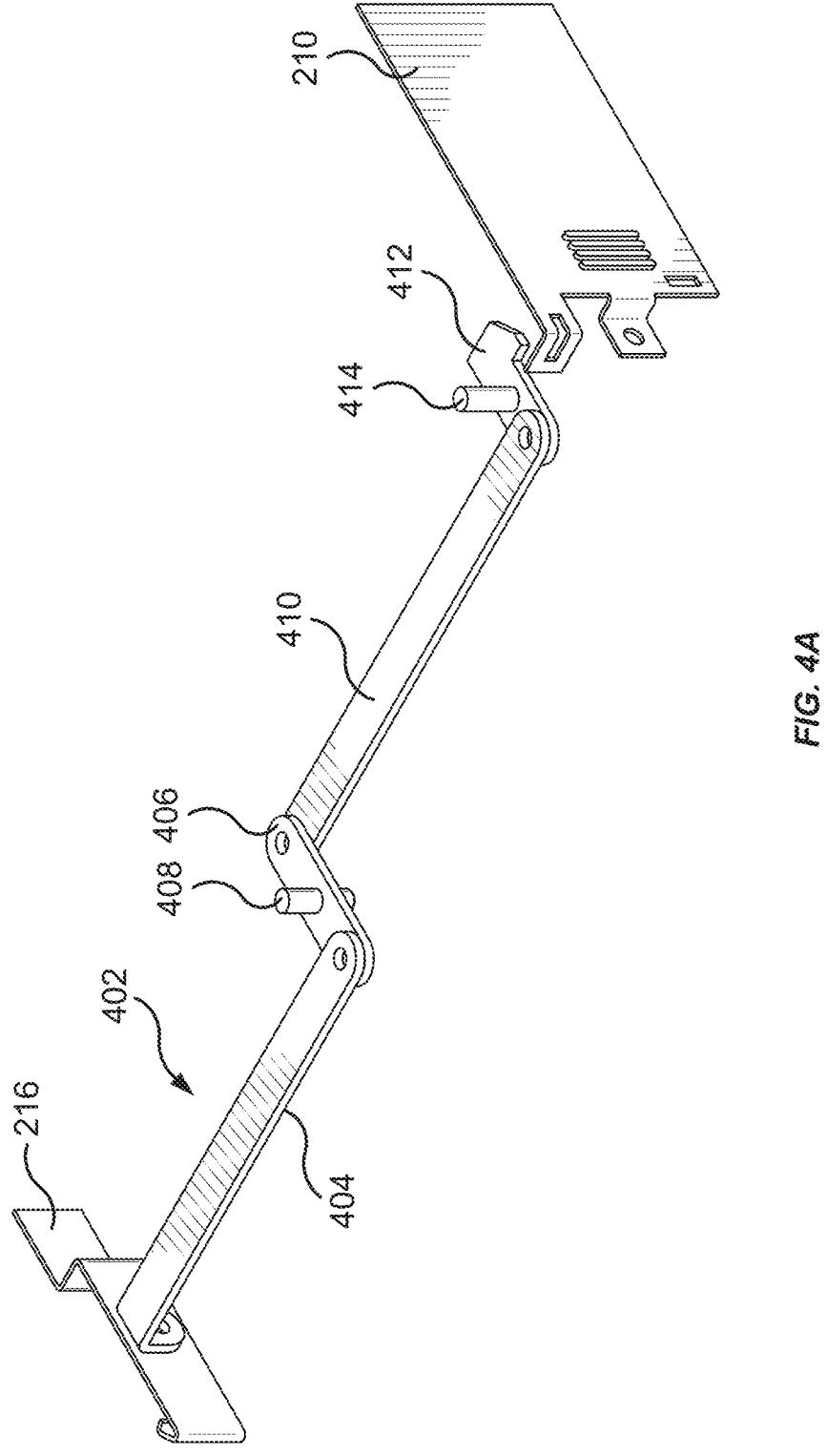
FIGS. 4A, 4B, and 4C illustrate a portion of an example cover of the electronic device in the system of FIG. 1A.
Figure 4B:
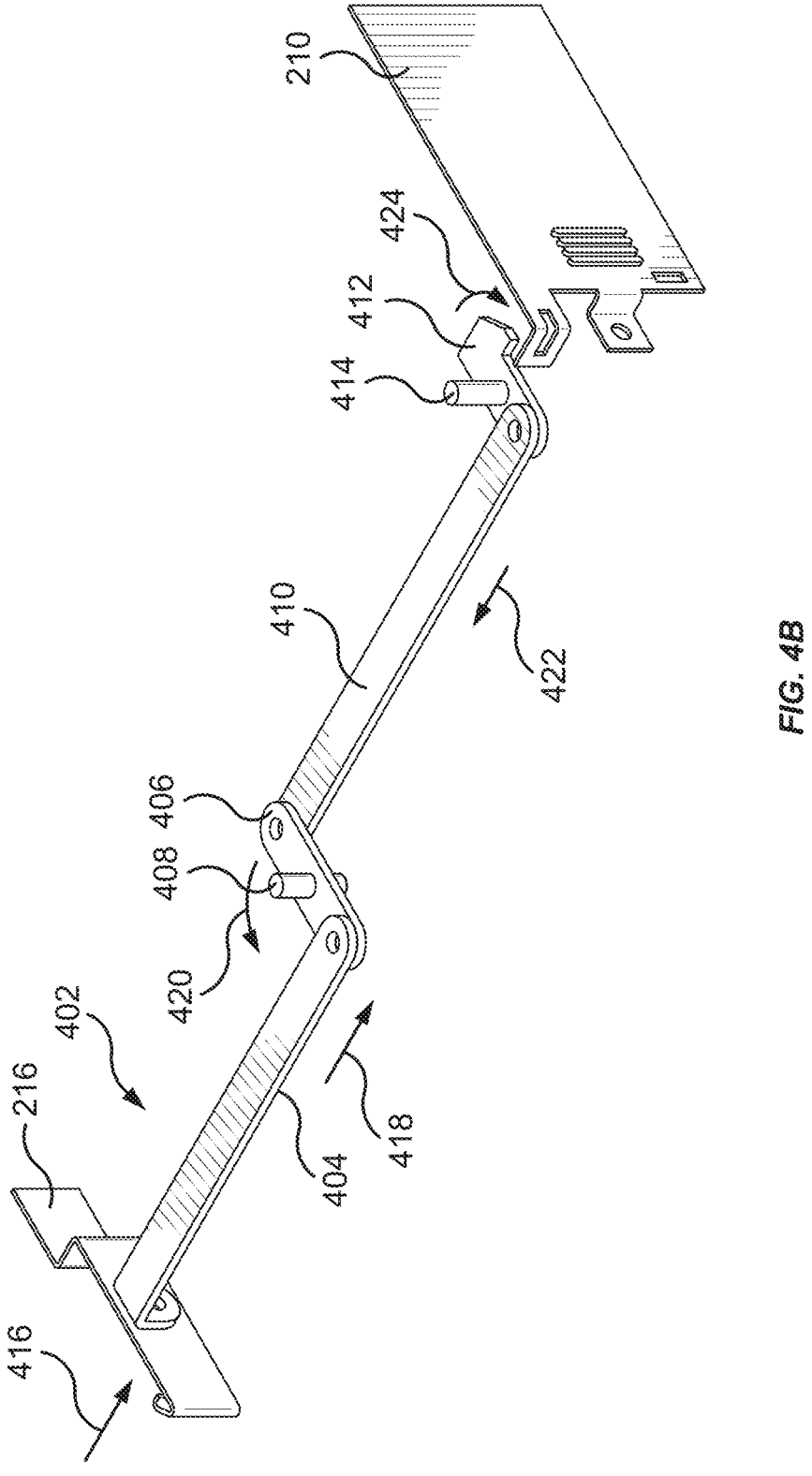

FIGS. 4A and 4B illustrate a portion of an example cover 204 of the electronic device 110 in the system 100 of FIG. 1A. Generally, FIG. 4A shows a side view of the mechanism that locks the door 210 when the second lever 216 is actuated. The mechanism may be positioned within the enclosure 206.

As seen in FIG. 4A, an arm 402 is positioned between the second lever 216 and the door 210. For example, the arm 402 may be coupled to the second lever 216 (e.g., by a screw, a bolt, an adhesive, a weld, etc.). The arm 402 includes several components that operate to lock the door 210 when the second lever 216 is actuated. The arm 402 includes an arm 404 positioned by the second lever 216. The arm 404 may be coupled to or attached to the second lever 216 (e.g., by a screw, a bolt, an adhesive, a weld, etc.). The arm 402 also includes an arm 406. The arm 406 may be attached to the arm 404 (e.g., by a bolt or screw). Additionally, the arm 406 may be coupled to a pin or post 408 such that the arm 406 may rotate about the pin or post 408. The arm 402 also includes an arm 410 attached to the arm 406 (e.g., by a screw or bolt). The arm 410 and the arm 404 may be attached to opposite ends of the arm 406. A latch 412 is attached to the arm 410 (e.g., by a screw or bolt) at an opposite end of the arm 410 as the arm 406. The latch 412 may also be coupled to a pin or post 414 such that the latch 412 may rotate about the pin or post 414.

In the example of FIG. 4A, the second lever 216 is in the locked state. As seen in FIG. 4A, when the second lever 216 is in the locked state, the latch 412 is disengaged from the door 210. Thus, the latch 412 does not lock the door 210 when the second lever 216 is in the locked state.

FIG. 4B shows a side view of the mechanism that locks the door 210 when the second lever 216 is actuated. As seen in FIG. 4B, the second lever 216 is actuated when the second lever 216 is pushed in the direction of the arrow 416. When the second lever 216 is pushed in the direction of the arrow 416, the second lever 216 moves in the direction of the arrow 416 (e.g., towards the door 210) to the unlocked state. The movement of the second lever 216 causes the second lever 216 to push the arm 404 in the direction of the arrow 418 (e.g., towards the door 210).

When the arm 404 is pushed in the direction of the arrow 418, the arm 404 pushes on the arm 406, which causes the arm 406 to rotate about the pin or post 408 in the direction of the arrow 420 (e.g., in the counter-clockwise direction in the perspective shown in FIG. 4B). When the arm 406 rotates in the direction of the arrow 420, the arm 406 pulls the arm 410 in the direction of the arrow 422 (e.g., away from the door 210). The arm 410 then moves in the direction of the arrow 422.

When the arm 410 moves in the direction of the arrow 422, the arm 410 pulls on the latch 412, which causes the latch 412 to rotate about the pint or post 414 in the direction of the arrow 424 (e.g., in the clockwise direction in the perspective shown in FIG. 4B). When the latch 412 rotates in the direction of the arrow 424, the latch 412 engages the door 210 and locks the door 210.

Figure 4C:
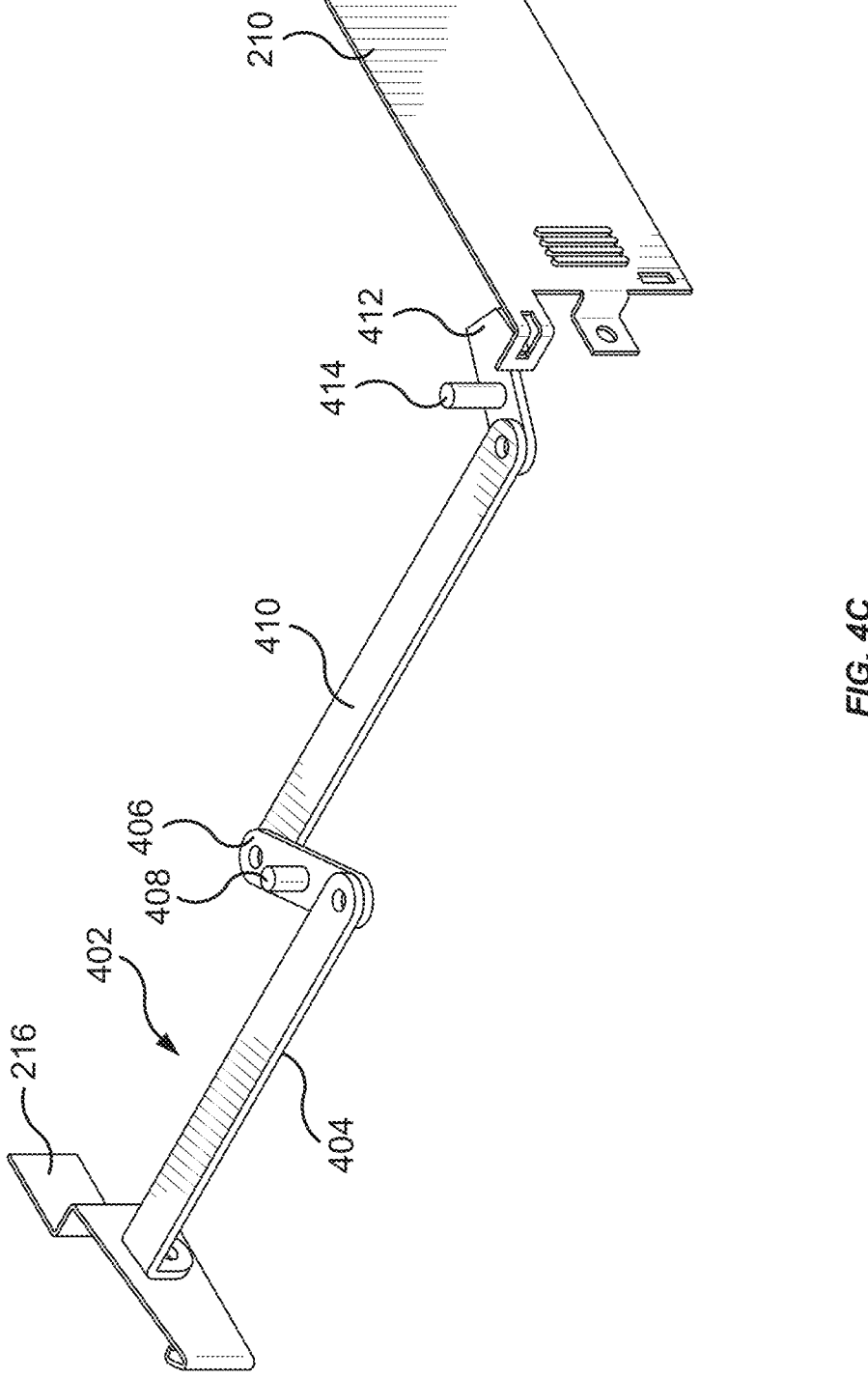

FIG. 4C shows a side view of the mechanism that locks the door 210 when the second lever 216 is actuated. As seen in FIG. 4C, the second lever 216 is in the unlocked state. The second lever 216 has pushed the arm 404 towards the door 210. The movement of the arm 404 rotates the arm 406 about the pin or post 408. The rotation of the arm 406 pulls the arm 410 away from the door 210. The movement of the arm 410 pulls the latch 412, which causes the latch 412 to rotate about the pin or post 414 to engage the door 210. Thus, when the second lever 216 is actuated, the door 210 may be locked and prevented from opening.

Figure 5A:
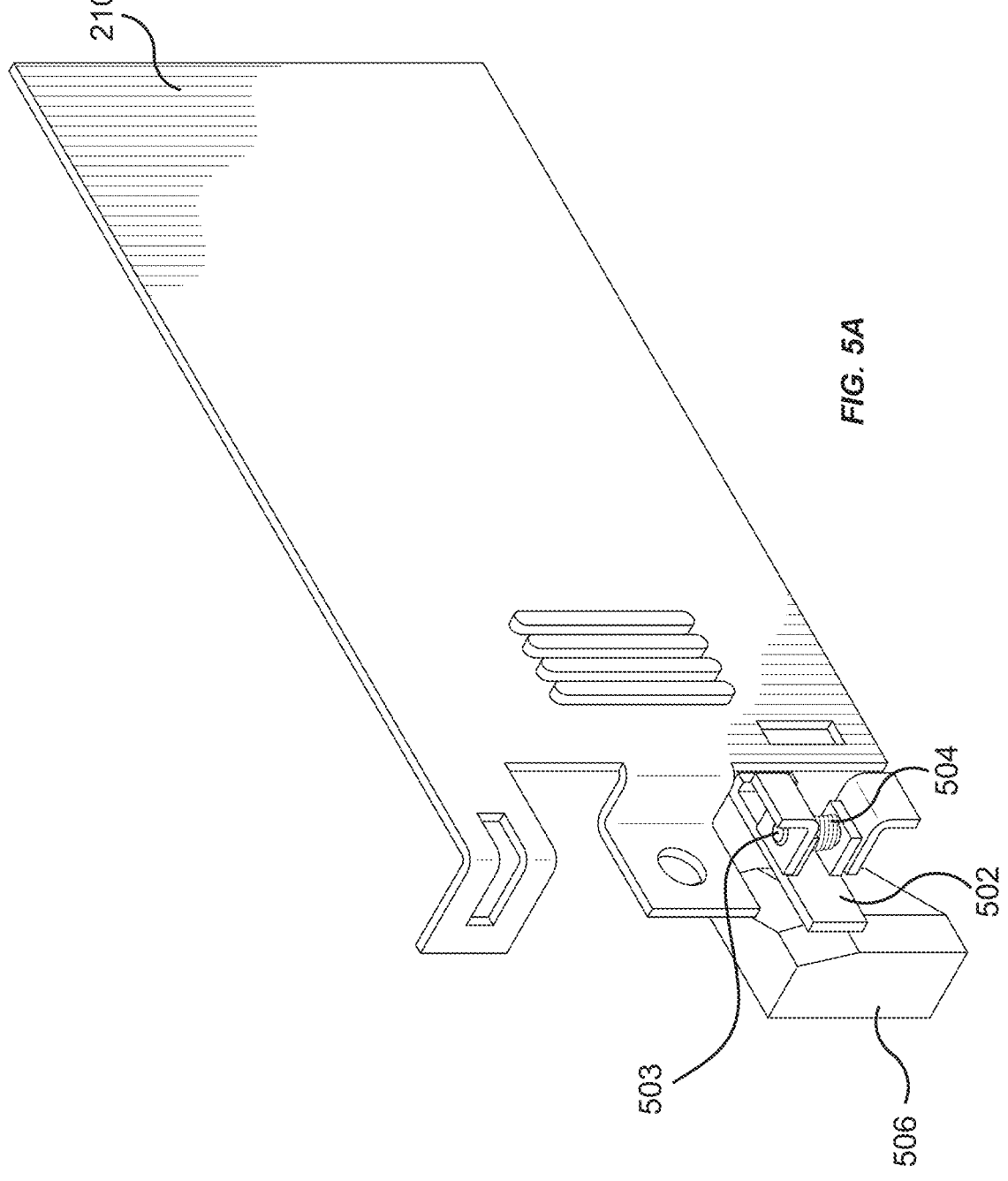
FIGS. 5A and 5B illustrate a portion of an example cover of the electronic device in the system of FIG. 1A.
Figure 5B:
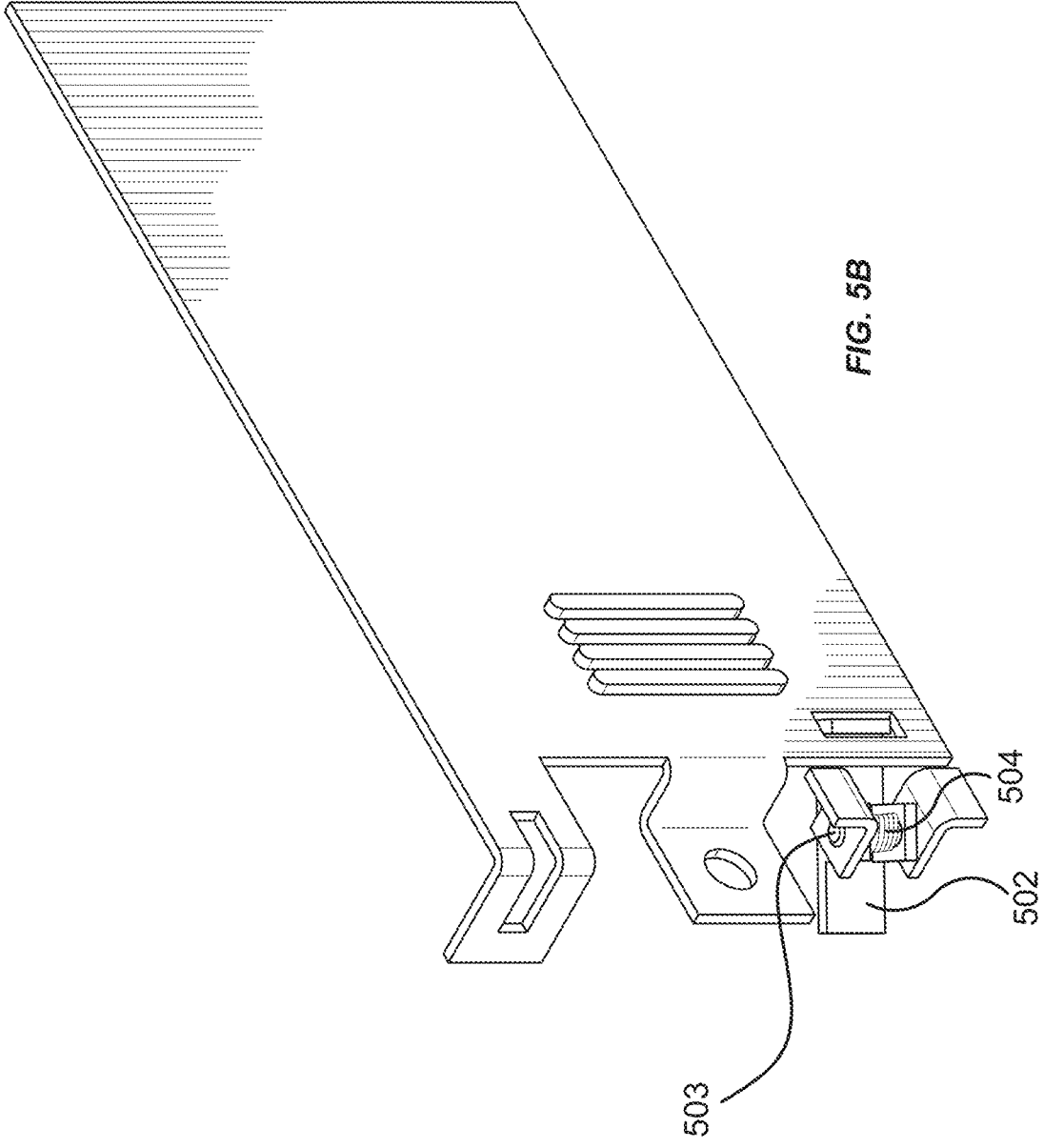

FIGS. 5A and 5B illustrate a portion of an example cover 204 of the electronic device 110 in the system 100 of FIG. 1A. Generally, FIG. 5A shows a side view of a mechanism that locks the door 210 when the cover 204 is disengaged or removed from the body 202. The mechanism may be positioned within the enclosure 206. In the example of FIG. 5A, the cover 204 is engaged with the body 202.

As seen in FIG. 5A, the electronic device 110 includes a latch 502. The latch 502 is coupled to a pin or post 503 such that the latch 502 may rotate about the pin or post 503. Additionally, a spring 504 (e.g., a torsion spring) is coupled to the pin or post 503. The spring 504 applies a force that causes the latch 502 to rotate about the pin or post 503 (e.g., in a clockwise direction in the perspective shown in FIG. 5) such that the latch 502 engages with the door 210 when no external force is applied to the latch 502.

The electronic device 110 includes a post 506. The post 506 may be attached to the body 202 of the electronic device 110 and extend from the body 202. When the cover 204 is positioned and engaged with the body 202, the post 506 may apply an external force on the latch 502, which opposes the force applied by the spring 504 and causes the latch 502 to rotate about the pin or post 503 (e.g., in a counter-clockwise direction in the perspective shown in FIG. 5). The rotation of the latch 502 may cause the latch 502 to disengage from the door 210, which unlocks the door 210 and allows the door 210 to open. The post 506 may prevent the spring 504 from rotating the latch 502 to lock the door 210 as long as the cover 204 remains engaged to the body 202 of the electronic device 110. As a result, when the cover 204 is engaged with the body 202 of the electronic device 110, the post 506 keeps the latch 502 from engaging with and locking the door 210.

FIG. 5B shows a side view of the mechanism that locks the door 210 when the cover 204 is disengaged or removed from the body 202. In the example of FIG. 5B, the cover 204 is disengaged and removed from the body 202. When the cover 204 is disengaged from the body 202, the post 506 is no longer positioned such that the post 506 applies a force to the latch 502 that opposes the force applied by the spring 504. As a result, the spring 504 causes the latch 502 to rotate about the pin or post 503 such that the latch 502 engages the door 210 and locks the door 210.

Figure 6:
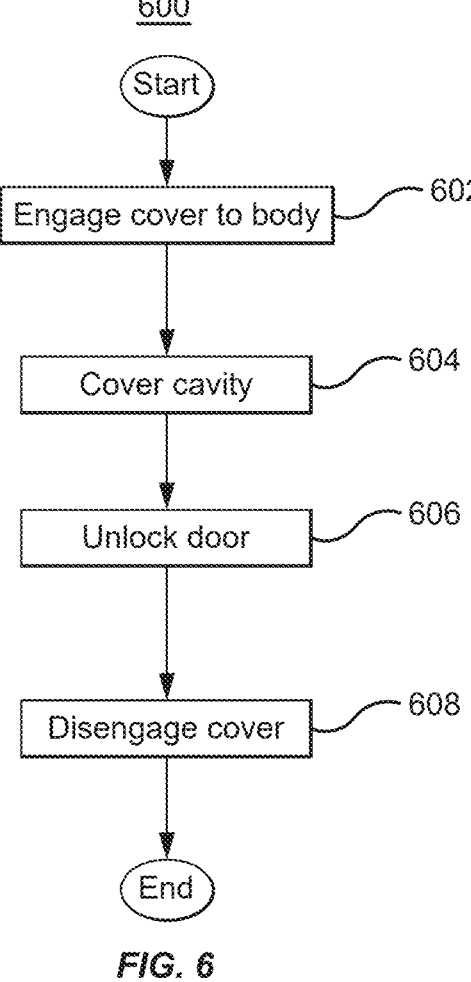
FIG. 6 is a flowchart of an example method performed by the system of FIG. 1A.

FIG. 6 is a flowchart of an example method 600 performed by the system 100 of FIG. 1A. Generally, different components of the electronic device 110 perform the steps of the method 600. By performing the method 600, the components of the electronic device 110 may lock or unlock the door 210.

In block 602, the first and second levers 212 and 216 engage the cover 204 to the body 202 of the electronic device 110. Generally, the cover 204 may be positioned on the body 202 such that the first and second levers 212 and 216 keep the cover 204 engaged with the body 202. When the cover 204 is engaged with the body 202, the post 506 may prevent the latch 502 from engaging and locking the door 210. In block 604, the door 210 covers the opening 208 defined by the cover 204. When the door 210 covers the opening 208, the door 210 may prevent access to the interior of the enclosure 206 through the opening 208.

In block 606, the first lever 212 unlocks the door 210. For example, when the first lever 212 is actuated (e.g., pushed), the first lever 212 may push an end 303 of the arm 302. An opposite end 305 of the arm 302 may then push on the latch 304, which causes the latch 304 to rotate about the pin or post 306. The rotation of the latch 304 may cause the stub 308 to disengage from the door 210. The door 210 may then be unlocked and may be opened to expose the interior of the enclosure 206.

If the second lever 216 is actuated (e.g., pushed), the second lever 216 may push the arm 404 towards the first lever 212 and the door 210. The arm 404 then pushes on the arm 406, which causes the arm 406 to rotate about the pin or post 408. The rotation of the arm 406 pulls the arm 410 away from the first lever 212 and the door 210. The arm 410 pulls the latch 412, which causes the latch 412 to rotate about the pin or post 414. The rotation of the latch 412 causes the latch 412 to engage the door 210 and lock the door 210. Thus, the door 210 is unlocked when the cover 204 is engaged with the body 202, the first lever 212 is actuated, and the second lever 216 is not actuated.

In block 608, the first and second levers 212 and 216 disengage the cover 204 from the body 202. When both the first and second levers 212 and 216 are actuated (e.g., pushed), the first and second levers 212 and 216 may disengage the cover 204 from the body 202. When the cover 204 is disengaged from the body 202, the cover 204 may be removed from the body 202. As discussed previously, when both the first and second levers 212 and 216 are actuated, the second lever 216 may cause the door 210 to be locked. Additionally, when the cover 204 is disengaged from the body 202, the latch 502 may engage the door 210 and keep the door 210 locked.

In summary, the electronic device 110 includes an enclosure 206 with a door 210 that provides access to the components of the electronic device 110 within the enclosure 206 (e.g., storage devices 116). The door 210 may be opened to provide access to the components of the electronic device 110 even though the cover 204 is engaged to the body 202. The cover 204 includes levers 212 and 216 that engage the cover 204 to the body 202. Actuating both levers 212 and 216 disengages the cover 204 from the body 202 such that the cover 204 may be removed from the body 202. Actuating one of the levers 212 unlocks the door 210 such that the door 210 may be opened to provide access to the components of the electronic device 110 within the enclosure 206.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to the described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not an advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any subject matter disclosed herein and shall not be considered to be an element or limitation of the appended claims except where explicitly recited in a claim(s).

Aspects of the described embodiments may take the form of an entirely hardware embodiment, an entirely software embodiment (including firmware, resident software, microcode, etc.) or an embodiment combining software and hardware aspects that may generally be referred to herein as a "circuit," "module" or "system."

One or more of the described embodiments may be a system, a method, and/or a computer program product. The computer program product may include a computer readable storage medium (or media) having computer readable program instructions thereon for causing a processor to carry out aspects of the embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the described embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the described embodiments.

Aspects of the described embodiments are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a described manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to one or more embodiments, other and further embodiments may be devised without departing from the basic scope thereof, and the scope thereof is determined by the claims that follow.

What is claimed is:

1. An apparatus comprising:
a body;
a cover defining an opening in a surface of the cover;
a door arranged to cover the opening;
a first lever coupled to the cover; and
a second lever coupled to the cover, wherein the first lever and the second lever are actuatable between a locked state and an unlocked state and configured to secure the cover to the body to form an enclosure when in the locked state, and wherein:
when the first lever is in the unlocked state and the second lever is in the locked state, the door is unlocked and movable to expose the opening; and
when both the first lever and the second lever are in the unlocked state, the cover is disengaged from the body such that the cover is removable from the body.

2. The apparatus of claim 1, further comprising:
an arm coupled to the second lever; and
a latch coupled to the arm, wherein when the second lever is in the unlocked state, the arm moves the latch such that the latch engages the door.

3. The apparatus of claim 2, wherein the arm comprises:
a first portion coupled to the second lever;
a second portion coupled to the first portion; and
a third portion coupled to the second portion and to the latch.

4. The apparatus of claim 3, wherein when the second lever is in the unlocked state:
the second lever pushes the first portion towards the door;
the first portion rotates the second portion such that the second portion pulls the third portion away from the door; and
the third portion rotates the latch such that the latch engages the door.

5. The apparatus of claim 1, further comprising a latch, wherein when the cover is removed from the body, the latch moves such that the latch engages the door.

6. The apparatus of claim 5, further comprising a spring arranged to move the latch to engage the door when the cover is removed from the body.

7. The apparatus of claim 1, further comprising:
an arm coupled to the first lever; and
a latch coupled to the arm, wherein when the first lever is in the unlocked state, the arm moves the latch such that the latch disengages the door.

8. The apparatus of claim 1, wherein the enclosure houses an electronic component when the cover is engaged to the body.

9. The apparatus of claim 8, wherein the electronic component comprises a solid state drive, and wherein when the door is unlocked, the door is movable to provide access to the solid state drive.

10. A method comprising:
engaging a cover to a body to form an enclosure by a first lever coupled to the cover and a second lever coupled to the cover, wherein the cover defines an opening in a surface of the cover;
covering, by a door, the opening;
unlocking the door such that the door is movable to expose the opening when the first lever is in an unlocked state and the second lever is in a locked state; and
disengaging the cover from the body such that the cover is removable from the body when both the first lever and the second lever are in the unlocked state.

11. The method of claim 10, further comprising moving, by an arm coupled to the second lever, a latch coupled to the arm such that the latch engages the door when the second lever is in the unlocked state.

12. The method of claim 11, wherein the arm comprises:
a first portion coupled to the second lever;
a second portion coupled to the first portion; and
a third portion coupled to the second portion and to the latch.

13. The method of claim 12, further comprising, when the second lever is in the unlocked state:
pushing, by the second lever, the first portion towards the door;
rotating, by the first portion, the second portion such that the second portion pulls the third portion away from the door; and
rotating, by the third portion, the latch such that the latch engages the door.

14. The method of claim 10, further comprising moving a latch such that the latch engages the door when the cover is removed from the body.

15. The method of claim 14, wherein a spring moves the latch to engage the door when the cover is removed from the body.

16. The method of claim 10, further comprising moving, by an arm coupled to the first lever, a latch coupled to the arm such that the latch disengages the door when the first lever is in the unlocked state.

17. The method of claim 10, wherein the enclosure houses an electronic component when the cover is engaged to the body.

18. The method of claim 17, wherein the electronic component comprises a solid state drive, and wherein when the door is unlocked, the door is movable to provide access to the solid state drive.

19. A checkout station comprising:
a cabinet; and
a device positioned within the cabinet, the device comprising:
a body;
a cover defining an opening in a surface of the cover;
a door arranged to cover the opening;
a solid state drive housed by the cover and the body when the cover is engaged with the body;
a first lever coupled to the cover; and
a second lever coupled to the cover, wherein:
when the first lever is in an unlocked state and the second lever is in a locked state, the door is unlocked and movable to expose the opening to provide access to the solid state drive; and
when both the first lever and the second lever are in the unlocked state, the cover is disengaged from the body such that the cover is removable from the body.

20. The checkout station of claim 19, wherein the device further comprises:
an arm coupled to the second lever; and
a latch coupled to the arm, wherein when the second lever is in the unlocked state, the arm moves the latch such that the latch engages the door.

* * * * *